United States Patent
Naito

(10) Patent No.: US 6,859,061 B2
(45) Date of Patent: Feb. 22, 2005

(54) DEVICE FOR ANALYZING FAILURE IN SEMICONDUCTOR DEVICE PROVIDED WITH INTERNAL VOLTAGE GENERATING CIRCUIT

(75) Inventor: Kensaku Naito, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/337,825

(22) Filed: Jan. 8, 2003

(65) Prior Publication Data

US 2004/0012406 A1 Jan. 22, 2004

(30) Foreign Application Priority Data

Jul. 16, 2002 (JP) ........................................ 2002-206756

(51) Int. Cl.⁷ .......................... G01R 31/26; G11C 7/00
(52) U.S. Cl. ...................................... 324/765; 365/201
(58) Field of Search ........................... 324/761, 757, 324/158.1, 765; 365/200, 201, 226; 714/718–731

(56) References Cited

U.S. PATENT DOCUMENTS

| | | | | |
|---|---|---|---|---|
| 4,468,759 A | * | 8/1984 | Kung et al. | ................. 365/201 |
| 5,768,290 A | * | 6/1998 | Akamatsu | .................. 714/732 |
| 6,228,666 B1 | * | 5/2001 | Kawano | ....................... 438/15 |
| 6,472,897 B1 | * | 10/2002 | Shyr et al. | ................... 324/765 |
| 6,490,701 B1 | * | 12/2002 | Roohparvar et al. | ........ 714/721 |

FOREIGN PATENT DOCUMENTS

| | | | |
|---|---|---|---|
| EP | 0585870 A2 | * 3/1994 | ........... G11C/29/00 |
| JP | 6-300824 | 10/1994 | |
| JP | 8-46001 | 2/1996 | |
| JP | 9-145795 | 6/1997 | |
| JP | 11-118887 | 4/1999 | |

* cited by examiner

*Primary Examiner*—Michael Tokar
*Assistant Examiner*—Paresh Patel
(74) *Attorney, Agent, or Firm*—McDermott Will & Emery LLP

(57) ABSTRACT

The variable power source applies to a wiring to which an internal voltage is being applied, a voltage equivalent to a reference voltage of the internal voltage from the outside of the semiconductor device. By this voltage application, the voltage being input to the voltage comparison circuit becomes equal to the reference voltage, so that a control signal causes the charge pump circuit to stop the operation. As the charge pump circuit is stopped, power supply voltage, power supply current and others of the semiconductor device become stable. Thus, even in the semiconductor device provided with an internal voltage generating circuit, a defective portion is detected precisely.

9 Claims, 14 Drawing Sheets

POWER SUPPLY CURRENT BEFORE EXTERNAL VOLTAGE APPLICATION

TIME

Tf

DEVICE FOR ANALYZING FAILURE IN SEMICONDUCTOR DEVICE PROVIDED WITH INTERNAL VOLTAGE GENERATING CIRCUIT

BACKGROUND OF THE INVENTION

1. Field of the Invention

The present invention relates to a device for analyzing failure in a semiconductor device, and more particularly to a device for analyzing failure in a semiconductor device provided with an internal voltage generating circuit.

2. Description of the Background Art

In one of the techniques of failure analysis of semiconductor devices, a semiconductor device is scanned with a laser beam, and a light induced current attributable to electron-hole pairs generated in the semiconductor device is measured using a scanning optical microscope. This technique is called an OBIC (Optical Beam Induced Current) method. With a similar technique called a non-bias OBIC method, a semiconductor device is again scanned with a laser beam, and thermal electromotive force that is generated when a material forming the semiconductor device is heated by the laser beam irradiation is measured.

In another technique of failure analysis of semiconductor device, a semiconductor device applied with a bias is scanned with a laser beam to locally heat the semiconductor device, and a change in electric resistance at the heated portion is measured. This technique is called an OBIRCH (Optical Beam Induced Resistance CHange) method. In this method, by application of the bias, the change of electric resistance is detected by presence/absence of current on a wiring or the like of the semiconductor device. The OBIRCH method is disclosed, e.g., in Japanese Patent Laying-Open No. 6-300824.

There is yet another technique similar to the OBIRCH method wherein a semiconductor device applied with a bias is scanned with an infrared (IR) laser beam to locally heat the semiconductor device, and a change in electric resistance at the heated portion is measured. This is called an IR-OBIRCH method. In the IR-OBIRCH method, infrared rays with which electron-hole pairs are not generated in the semiconductor device are used for the laser beam irradiation to suppress generation of a light induced current. The laser beam is used solely as a heat source. The IR-OBIRCH method is disclosed, e.g., in Japanese Patent Laying-Open No. 9-145795.

FIGS. 16–19 are schematic diagrams showing various configurations of a device for conducting the failure analysis of semiconductor device as described above (hereinafter, referred to as the "semiconductor failure analysis device"). As shown in FIGS. 16–19, the configurations of the semiconductor failure analysis device is classified into four types depending on whether the measuring instrument is an amperemeter or a voltmeter, and whether the measuring instrument is connected to a power supply terminal or a ground terminal of the semiconductor device.

The semiconductor failure analysis devices shown in FIGS. 16 and 18 each include a semiconductor device 1 for which failure analysis is conducted, a laser microscope 2 applying light energy or thermal energy to semiconductor device 1, a variable stabilizing power source 3 applying a variable voltage to semiconductor device 1, and an amperemeter 4 measuring a change of a current flowing through semiconductor device 1 at the time of failure analysis. The semiconductor failure analysis devices shown in FIGS. 17 and 19 each include, instead of the amperemeter 4 shown in FIGS. 16 and 18, a voltmeter 5 measuring a change of a voltage being applied across semiconductor device 1 at the time of failure analysis.

FIG. 16 shows the configuration having amperemeter 4 connected to the ground terminal of semiconductor device 1. FIG. 17 shows the configuration having voltmeter 5 connected to the ground terminal of semiconductor device 1. FIG. 18 shows the configuration having amperemeter 4 connected to the power supply terminal of semiconductor device 1, and FIG. 19 shows the configuration having voltmeter 5 connected to the power supply terminal of semiconductor device 1.

In the failure analysis techniques of semiconductor devices as described above wherein a laser beam is employed to measure current change or voltage change occurring in the semiconductor device, the amount of the current or voltage change due to the laser beam irradiation is extremely small. To make such a failure analysis technique applicable to a semiconductor device, it is necessary to keep the semiconductor device in a static state such that the current or voltage being input to amperemeter 4 or voltmeter 5 would not vary because of any other reason but the laser beam irradiation.

However, a semiconductor device provided with an internal voltage generating circuit (e.g., a DRAM (Dynamic Random Access Memory)) cannot be maintained in the static state, as an internal voltage is generated to enable an operation of the semiconductor integrated circuit. In such a device, even if power supply voltage, power supply current, external signal input and others are maintained in the static state, they would vary due to the internal voltage generating operation. Thus, the failure analysis techniques as described above were not applicable to the semiconductor device provided with an internal voltage generating circuit like a DRAM.

FIG. 20 is a schematic diagram of an internal voltage generating circuit 11 provided in a semiconductor device such as a DRAM.

The internal voltage generating circuit 11 shown in FIG. 20 includes a charge pump circuit 6 generating a voltage V on a wiring 7, and a voltage comparison circuit 9 comparing the voltage V on wiring 7 with a reference voltage Vref on a wiring 8. Although the internal voltage generating circuit may generate a positive voltage or a negative voltage, the case where a positive voltage is generated is now described.

Voltage V on wiring 7 and reference voltage Vref on wiring 8 are applied to voltage comparison circuit 9. Voltage comparison circuit 9 compares voltage V with reference voltage Vref, and transmits a control signal f on a wiring 10 to charge pump circuit 6 based on the comparison result. When voltage V is lower than reference voltage Vref, control signal f causes charge pump circuit 6 to operate to generate a higher voltage. When voltage V is equal to or higher than reference voltage Vref, control signal f causes charge pump circuit 6 to stop the operation. As such, voltage V is adjusted to equal the reference voltage Vref.

Voltage V, reference voltage Vref and others generated by internal voltage generating circuit 11 are normally generated from a power supply voltage of the semiconductor device. Thus, as internal voltage generating circuit 11 operates, the power supply voltage and the power supply current would change with amounts that are generally greater than the amount of voltage change or current change due to the laser beam irradiation in the failure analysis technique of semiconductor device as described above.

As such, in the failure analysis of the semiconductor device provided with an internal voltage generating circuit, even if there is a voltage change or current change as the laser beam irradiates a defective portion, such a change would be hidden in the change of power supply voltage or power supply current, hindering detection of the defective portion.

Moreover, even if the voltage change or current change by the laser beam irradiation at the defective portion is unhidden by the change of power supply voltage or power supply current, in the case where a power supply terminal of the semiconductor device is used as a detecting terminal of the voltage change or current change that occurs at the defective portion by the laser beam irradiation, it would be difficult to detect the defective portion if a current consumed by the internal voltage generating circuit is greater than a leakage current at the relevant defective portion.

Furthermore, since the change of power supply voltage or power supply current caused by the operation of the internal voltage generating circuit is asynchronous with the laser beam scanning during the failure analysis of the semiconductor device, it causes a noise, which may lead to misinterpretation of a non-defective portion as a defective portion.

SUMMARY OF THE INVENTION

An object of the present invention is to provide a semiconductor failure analysis device applicable to failure analysis of a semiconductor device provided with an internal voltage generating circuit.

According to an aspect of the present invention, a device for analyzing failure in a semiconductor device provided with an internal voltage generating circuit includes a variable power source applying to the internal voltage generating circuit a voltage equivalent to a reference voltage of the internal voltage generating circuit, and a failure detecting unit detecting a defective portion of the semiconductor device in a state where the voltage is being applied from the variable power source to the internal voltage generating circuit.

According to another aspect of the present invention, a device for analyzing failure in a semiconductor device provided with an internal voltage generating circuit includes a circuit applying to a wiring in the semiconductor device to which an internal voltage is applied, a voltage equivalent to a reference voltage of the internal voltage from the outside of the semiconductor device, a light source scanning the semiconductor device with a laser beam, and a circuit detecting one of a current change and a voltage change in the semiconductor device.

As such, according to the present invention, a defective portion in the semiconductor device is detected while a voltage is being applied from the variable power source to the internal voltage generating circuit. Therefore, the defective portion can be detected precisely even in the semiconductor device provided with the internal voltage generating circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
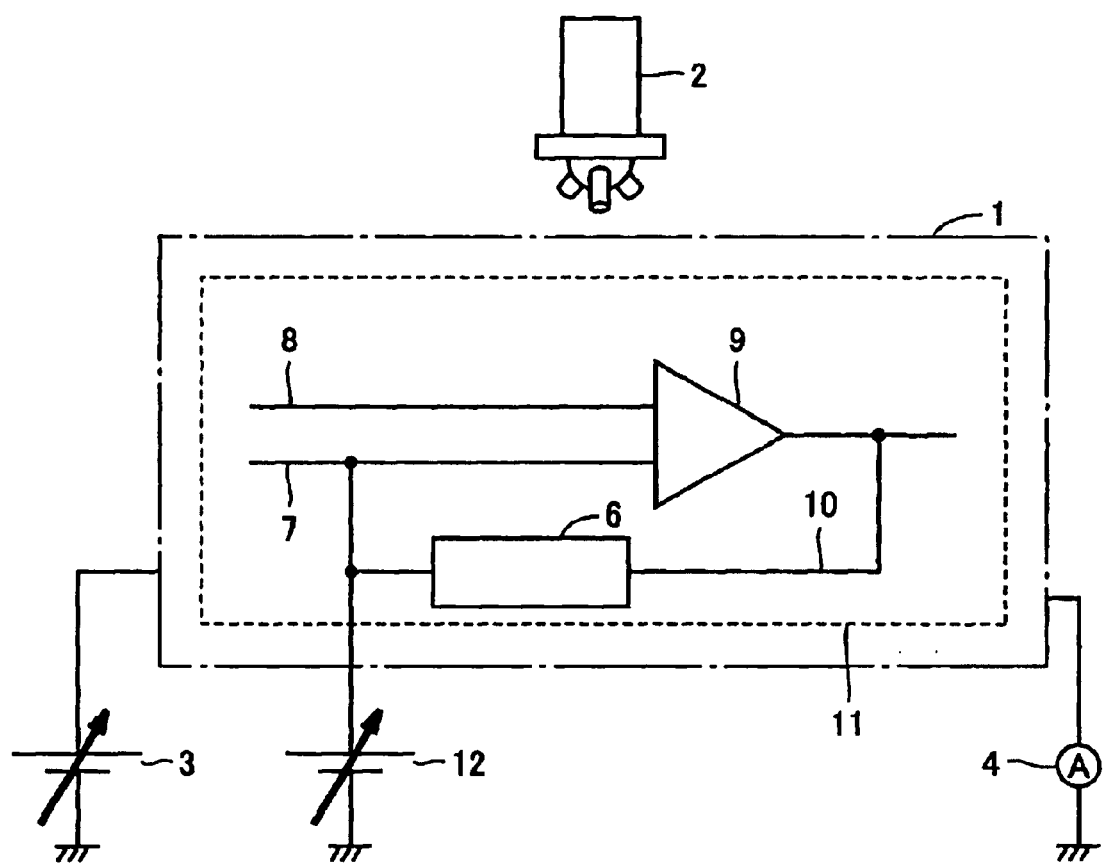
FIGS. 1–4 are schematic diagrams illustrating various configurations of the semiconductor failure analysis device according to a first embodiment of the present invention.

Hereinafter, embodiments of the present invention will be described in detail with reference to the drawings. In the drawings, the same or corresponding portions are denoted by the same reference characters, and description thereof will not be repeated.

First Embodiment

The configurations of the semiconductor failure analysis device of the first embodiment shown in FIGS. 1–4, corresponding to FIGS. 16–19 above, are classified into four types depending on whether the measuring instrument is an amperemeter or a voltmeter, and whether the measuring instrument is connected to a power supply terminal or a ground terminal of the semiconductor device.

Figure 2:
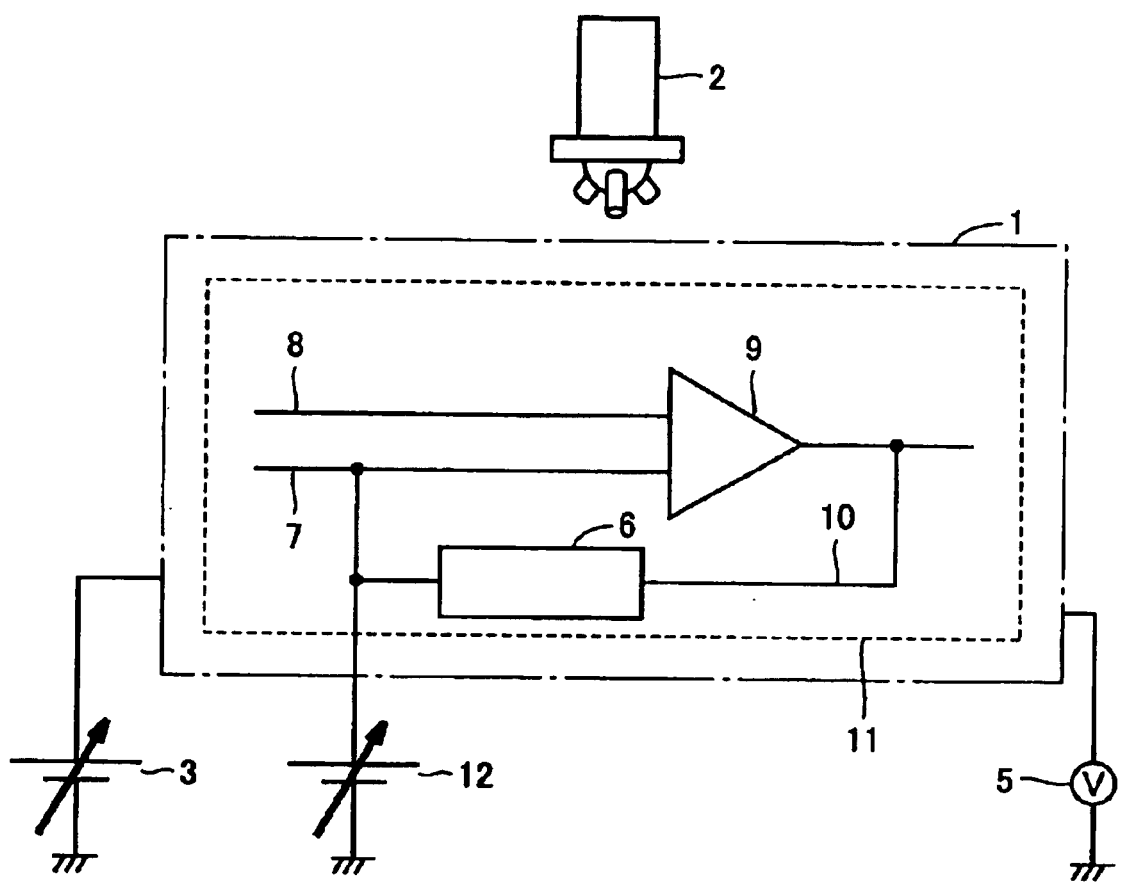
Figure 3:
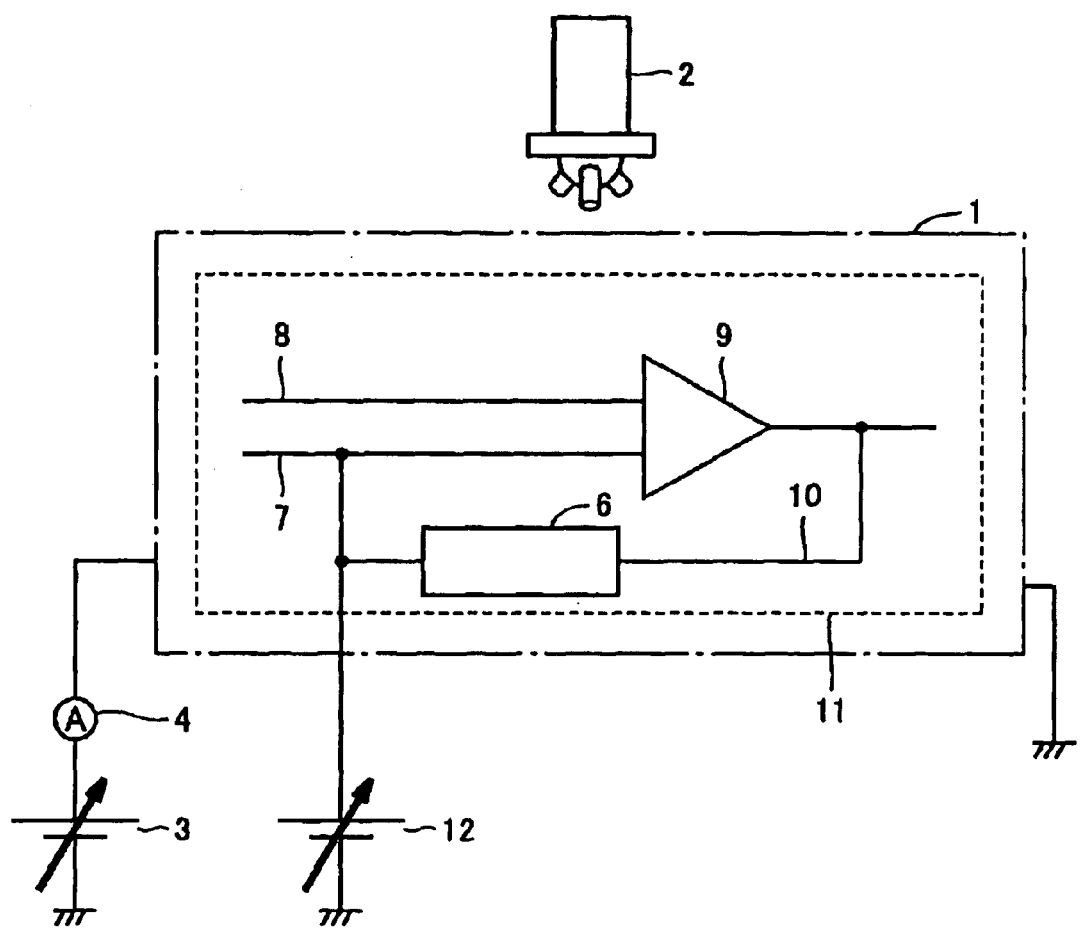

The semiconductor failure analysis devices shown in FIGS. 1 and 3 each include a semiconductor device 1 provided with an internal voltage generating circuit 11 for which failure analysis is conducted, a laser microscope 2 applying light energy or thermal energy to semiconductor device 1, a variable stabilizing power source 3 applying a variable voltage to semiconductor device 1, an amperemeter 4 measuring a change of a current flowing through semiconductor device 1 at the time of failure analysis, and a variable power source 12 applying a variable voltage from the outside of semiconductor device 1 to a wiring 7 of a voltage V in internal voltage generating circuit 11. The semiconductor failure analysis devices shown in FIGS. 2 and 4 each include a voltmeter 5 measuring a change of a voltage being applied across semiconductor device 1 at the time of failure analysis, instead of amperemeter 4 shown in FIGS. 1 and 3.

Figure 4:
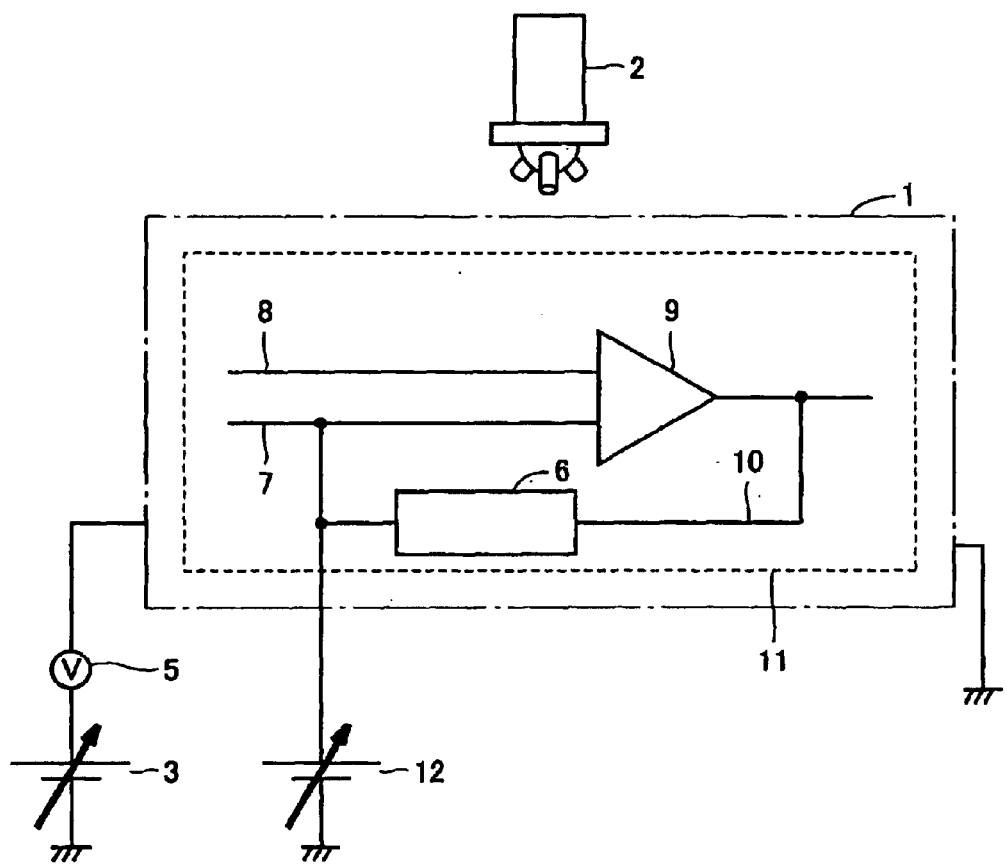

FIG. 1 shows the configuration having amperemeter 4 connected to a ground terminal of semiconductor device 1, and FIG. 2 shows the configuration having voltmeter 5 connected to the ground terminal of semiconductor device 1. FIG. 3 shows the configuration having amperemeter 4 connected to a power supply terminal of semiconductor device 1, and FIG. 4 shows the configuration having voltmeter 5 connected to the power supply terminal of semiconductor device 1. An operation common to the devices shown in FIGS. 1–4 is now explained.

Variable power source 12 externally applies a voltage equivalent to a reference voltage Vref on a wiring 8 to wiring 7 of voltage V. With this voltage application, voltage V being input to voltage comparison circuit 9 becomes equal to reference voltage Vref, so that a control signal f on a wiring 10 causes charge pump circuit 6 to stop the operation. With the operation of charge pump circuit 6 suspended, the power supply voltage, power supply current and others of semiconductor device 1 become stable.

Figure 5:
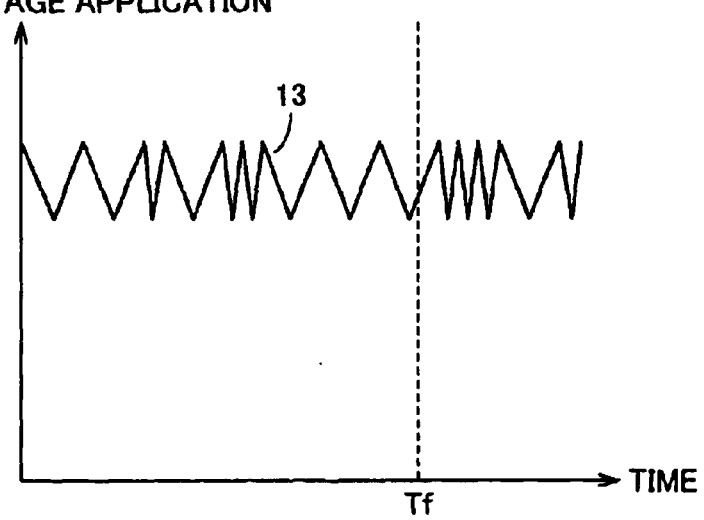
FIG. 5 illustrates a power supply current of the semiconductor device before applying a voltage from the outside of the semiconductor device using the semiconductor failure analysis device of the first embodiment.

FIG. 5 shows the power supply current 13 of the semiconductor device before a voltage is externally applied by the semiconductor failure analysis device of the first embodiment. The power supply current may have any waveform, not limited to that in FIG. 5. The time when a defect was detected in the semiconductor device is indicated by Tf on the time axis.

Generally, the change of power supply current of a semiconductor device provided with an internal voltage generating circuit becomes greater than the amount of current change due to laser beam irradiation during the failure analysis of the semiconductor device. Thus, as shown in FIG. 5, even if there is a current change in a defective portion irradiated by the laser beam, such a change is hidden in the change of power supply current 13, and the defective portion cannot be detected.

Figure 6:
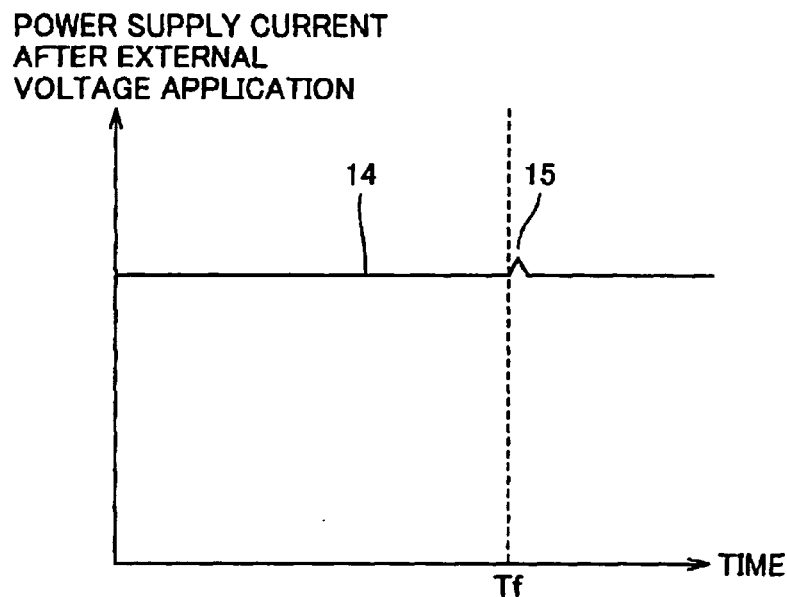
FIG. 6 illustrates a power supply current of the semiconductor device after applying a voltage from the outside of the semiconductor device using the semiconductor failure analysis device of the first embodiment.

FIG. 6 shows the power supply current 14 of the semiconductor device after externally applying a voltage by the semiconductor failure analysis device of the first embodiment. The time when a defect was detected in the semiconductor device is indicated by Tf on the time axis.

As shown in FIG. 6, with the power supply current 14 of the semiconductor device being stabilized, a current change 15 that occurred in a defective portion as irradiated by a laser beam becomes outstanding. Thus, the defective portion in the semiconductor device provided with an internal voltage generating circuit can be detected. Although the case associated with power supply current of the semiconductor device has been illustrated in FIGS. 5 and 6, the same applies to the case of power supply voltage thereof.

Figure 7:
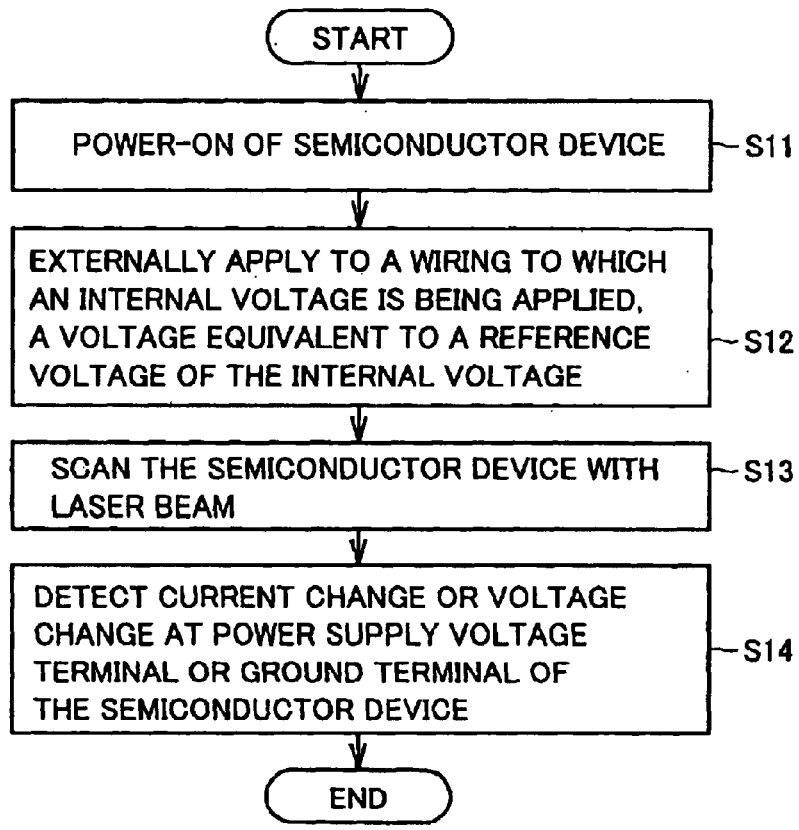
FIG. 7 is a flow diagram illustrating operational procedure of the semiconductor failure analysis device of the first embodiment.

The operational procedure of the semiconductor failure analysis device according to the first embodiment is now described with reference to the flow chart in FIG. 7.

Firstly, in step S11, the semiconductor device is powered on.

In step S12, a voltage equivalent to reference voltage Vref on wiring 8 is applied from the outside of the semiconductor device to wiring 7 of voltage V.

In step S13, the semiconductor device is scanned with a laser beam.

In step S14, a change in current or voltage at the power supply terminal or ground terminal of the semiconductor device is detected.

As a way of externally applying a voltage equivalent to reference voltage Vref on wiring 8 to wiring 7 of voltage V, bonding or manual probing may be conducted on pad (electrode) 70 for measurement of internal voltage that is provided in the semiconductor device. If pad 70 for measurement of internal voltage is unprovided, probing may be conducted directly on wiring 7 of voltage V. Further, if wiring 7 of voltage V is too thin to conduct probing directly thereon, probing may be carried out employing a FIB (Focused Ion Beam) device provided with a function to deposit metal film.

As described above, according to the first embodiment, the failure analysis of semiconductor device by laser beam scanning is performed while a voltage equivalent to reference voltage Vref on wiring 8 is being applied to wiring 7 of voltage V from the outside of the semiconductor device. Therefore, a defective portion can be detected precisely even in a semiconductor device provided with an internal voltage generating circuit.

Second Embodiment

In the semiconductor failure analysis device of the first embodiment, a current flowing from a power source of the semiconductor device to the circuits associated with the internal voltage generating circuit decreases, as the operation of the internal voltage generating circuit provided with power from the power source is stopped. As such, if it is attempted to detect a defect attributable to the internal voltage from a change in the power supply current or power supply voltage, the defective portion may not be specified successfully.

Accordingly, in the second embodiment, a variable voltage application terminal of variable power source 12 is used as a detecting terminal of current change or voltage change for the semiconductor failure analysis, instead of the power supply terminal or ground terminal as in the conventional case and in the first embodiment.

Figure 8:
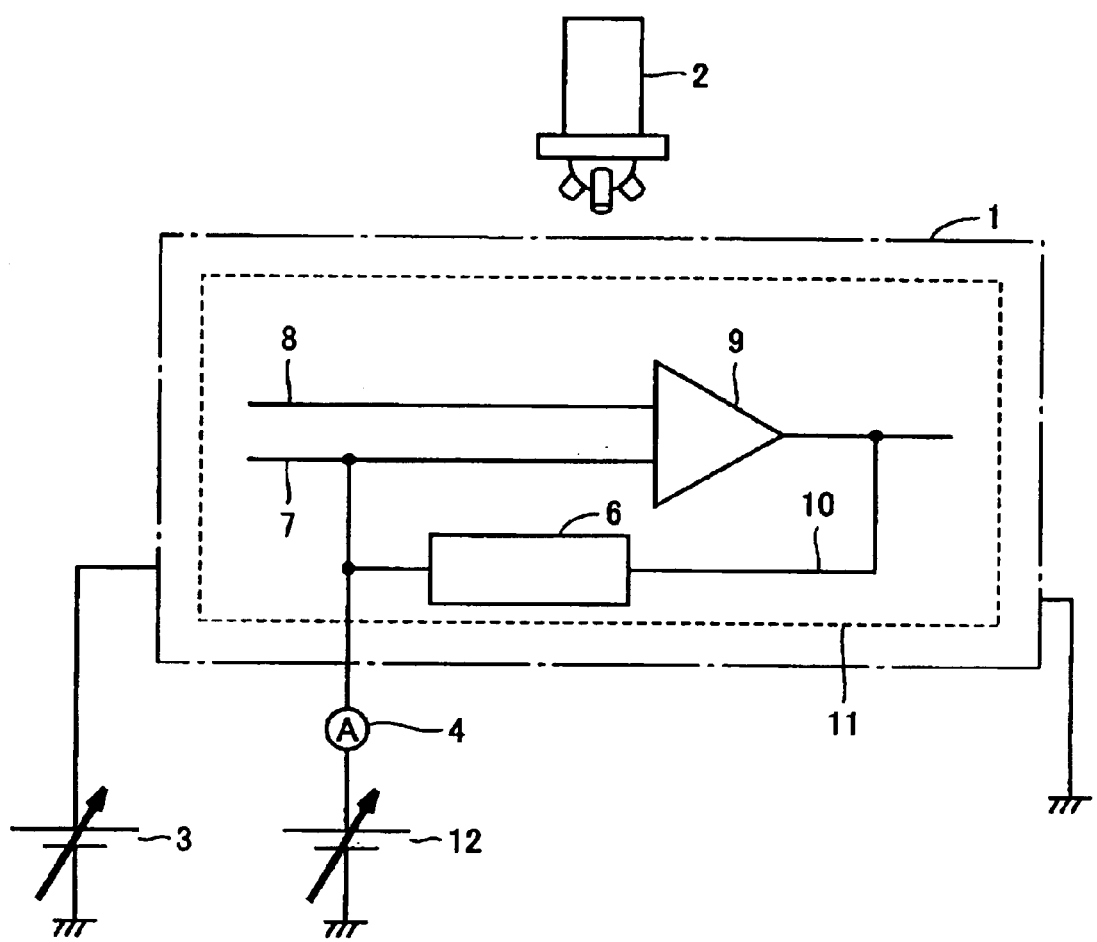
FIGS. 8 and 9 are schematic diagrams illustrating configurations of the semiconductor failure analysis device according to a second embodiment of the present invention.

Referring to FIG. 8, the semiconductor failure analysis device according to the second embodiment in one configuration includes a semiconductor device 1 provided with an internal voltage generating circuit 11 for which failure analysis is conducted, a laser microscope 2 applying light energy or thermal energy to semiconductor device 1, a variable stabilizing power source 3 applying a variable voltage to semiconductor device 1, a variable power source 12 applying a variable voltage from the outside of semiconductor device 1 to a wiring 7 of a voltage V in internal voltage generating circuit 11, and an amperemeter 4 measuring a change of a current flowing through semiconductor device 1 at the time of failure analysis from a variable voltage application terminal 20 of variable power source 12.

Figure 9:
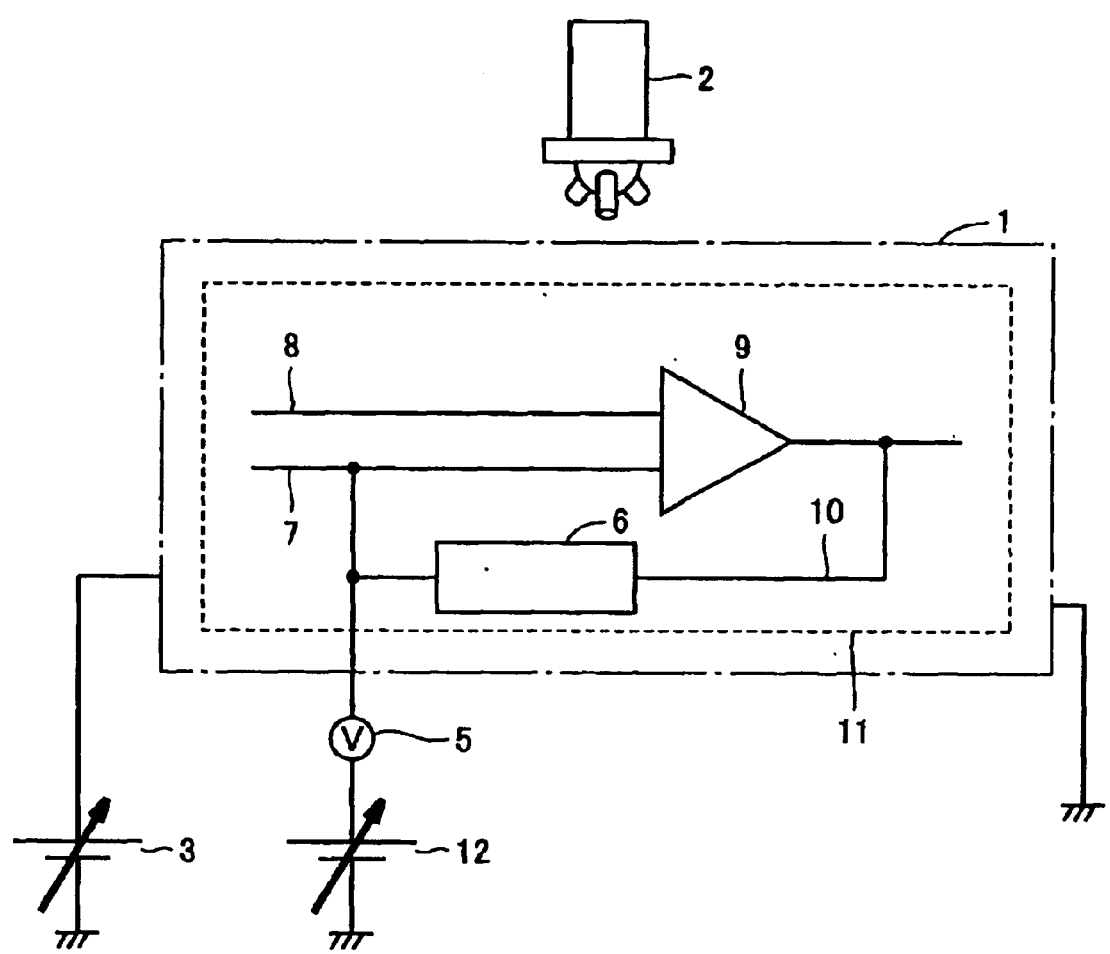

Referring to FIG. 9, the semiconductor failure analysis device according to the second embodiment in another configuration includes a semiconductor device 1 provided with an internal voltage generating circuit 11 for which failure analysis is conducted, a laser microscope 2 applying light energy or thermal energy to semiconductor device 1, a variable stabilizing power source 3 applying a variable voltage to semiconductor device 1, a variable power source 12 applying a variable voltage from the outside of semiconductor device 1 to a wiring 7 of a voltage V in internal voltage generating circuit 11, and a voltmeter 5 measuring a change of a voltage being applied across semiconductor device 1 at the time of failure analysis from a variable voltage application terminal 20 of variable power source 12.

Since a current change or voltage change is detected from the variable voltage application terminal of variable power source 12, the number of circuits existent between a defective portion and a defect detecting portion decreases. Thus, even in the state where internal voltage generating circuit 11 is stopped and a current flowing from the power source to the circuits associated with the internal voltage decreases, a portion that is suffering failure due to the internal voltage can be detected and specified with a high probability.

Figure 10:
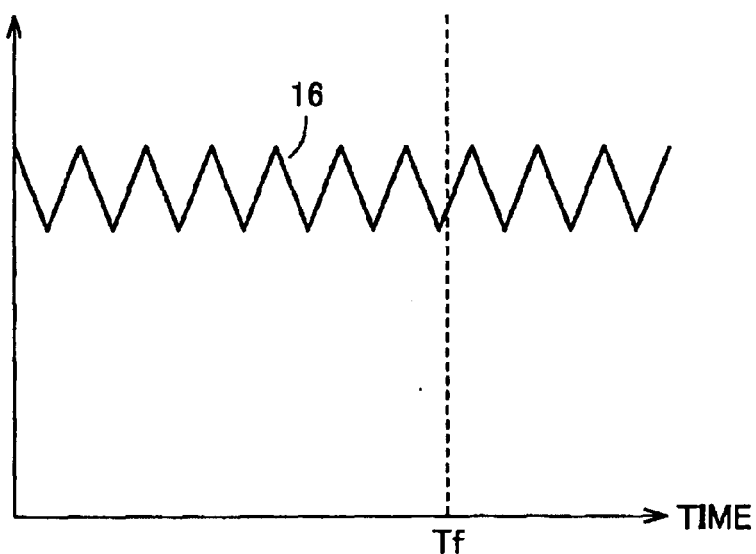
FIG. 10 illustrates a power supply current of the semiconductor device before applying a voltage from the outside of the semiconductor device using the semiconductor failure analysis device of the second embodiment.

FIG. 10 shows the power supply current 16 of the semiconductor device before applying a voltage from the outside of the semiconductor device using the semiconductor failure analysis device of the second embodiment. The power supply current may have any waveform, not limited to that of FIG. 10. The time when a defect was detected in the semiconductor device is indicated by Tf on the time axis.

Generally, the change of power supply current of the semiconductor device provided with an internal voltage generating circuit becomes greater than the amount of current change by laser irradiation upon failure analysis of the semiconductor device. Thus, as shown in FIG. 10, even if a current change occurs in a defective portion due to the laser beam irradiation, the change would be hidden in the change of power supply current 16, hindering detection of the defective portion.

Figure 11:
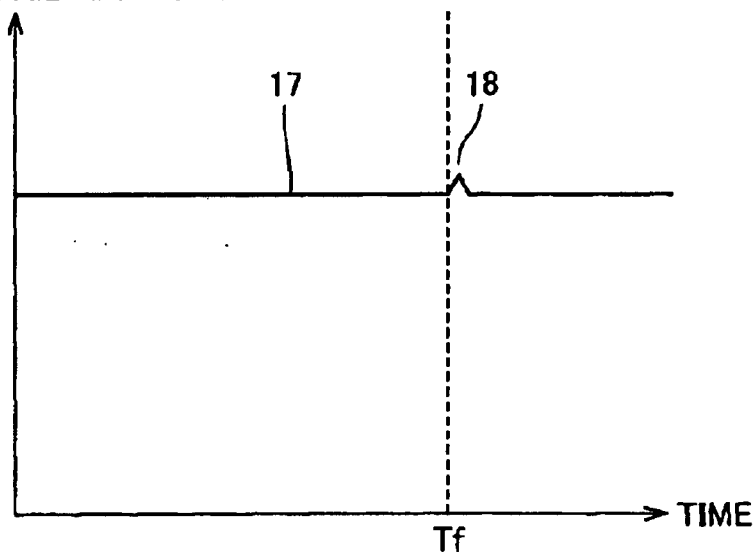
FIG. 11 illustrates a power supply current of the semiconductor device after applying a voltage from the outside of the semiconductor device using the semiconductor failure analysis device of the second embodiment.

FIG. 11 shows the power supply current 17 of the semiconductor device after a voltage is externally applied using the semiconductor failure analysis device of the second embodiment. The time when a defect was detected in the semiconductor device is indicated by Tf on the time axis.

As shown in FIG. 11, stabilization of power supply current 17 of the semiconductor device allows the current change 18 in a defective portion caused by laser beam irradiation to stand out, enabling detection of the defective portion in the semiconductor device provided with an internal voltage generating circuit. Although the case associated with power supply current of the semiconductor device has been shown in FIGS. 10 and 11, the same applies to the case of power supply voltage thereof.

Figure 12:
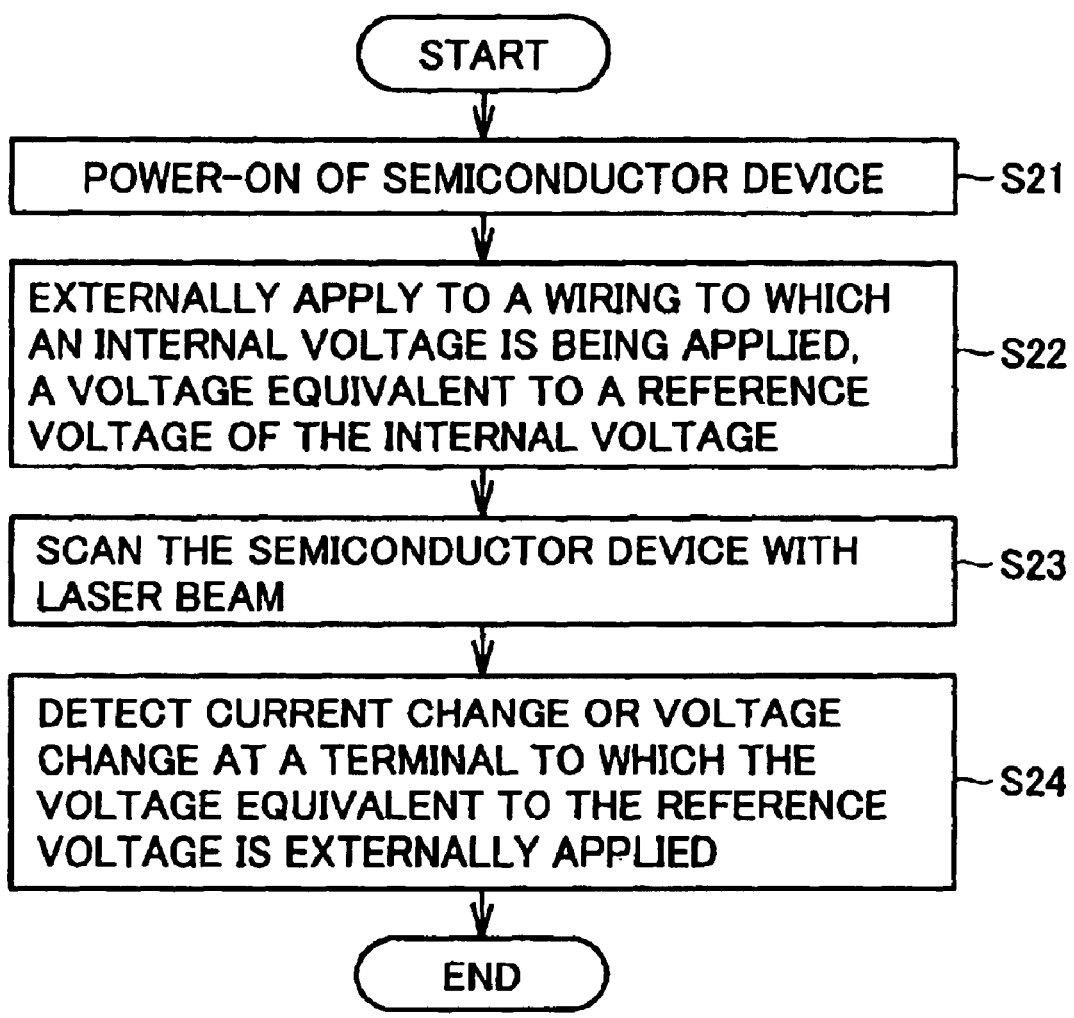
FIG. 12 is a flow diagram illustrating operational procedure of the semiconductor failure analysis device of the second embodiment.

The operational procedure of the semiconductor failure analysis device of the second embodiment is now described with reference to the flow chart in FIG. 12.

Firstly, in step S21, the semiconductor device is powered on.

In step S22, a voltage equivalent to reference voltage Vref on wiring 8 is applied from the outside of the semiconductor device to wiring 7 of voltage V.

In step S23, the semiconductor device is scanned with a laser beam.

In step S24, a change in current or voltage is detected at a variable voltage application terminal of variable power source 12.

As described above, according to the second embodiment, the current change or voltage change is detected from the variable voltage application terminal of variable power source 12. This decreases the number of circuits lying between a defective portion and a defect detecting portion. Accordingly, even in the state where internal voltage generating circuit 11 is stopped and a current flowing from the power source to the circuits associated with the internal voltage is decreased, a portion suffering failure attributable to the internal voltage can be detected and specified with a high probability.

Third Embodiment

In the semiconductor failure analysis devices described in the first and second embodiments, a voltage equivalent to reference voltage Vref on wiring 8 is applied to wiring 7 of voltage V. Since this reference voltage Vref is of a normal semiconductor device, it is different in the strict sense from the reference voltage of a semiconductor device suffering failure. As such, the defective portion of the semiconductor device may not be specified with accuracy.

Accordingly, in the third embodiment, instead of a voltage equivalent to reference voltage Vref on wiring 8, a voltage equivalent to an internal voltage being generated at the time when the semiconductor device is suffering failure is applied to wiring 7 of voltage V.

Figure 13:
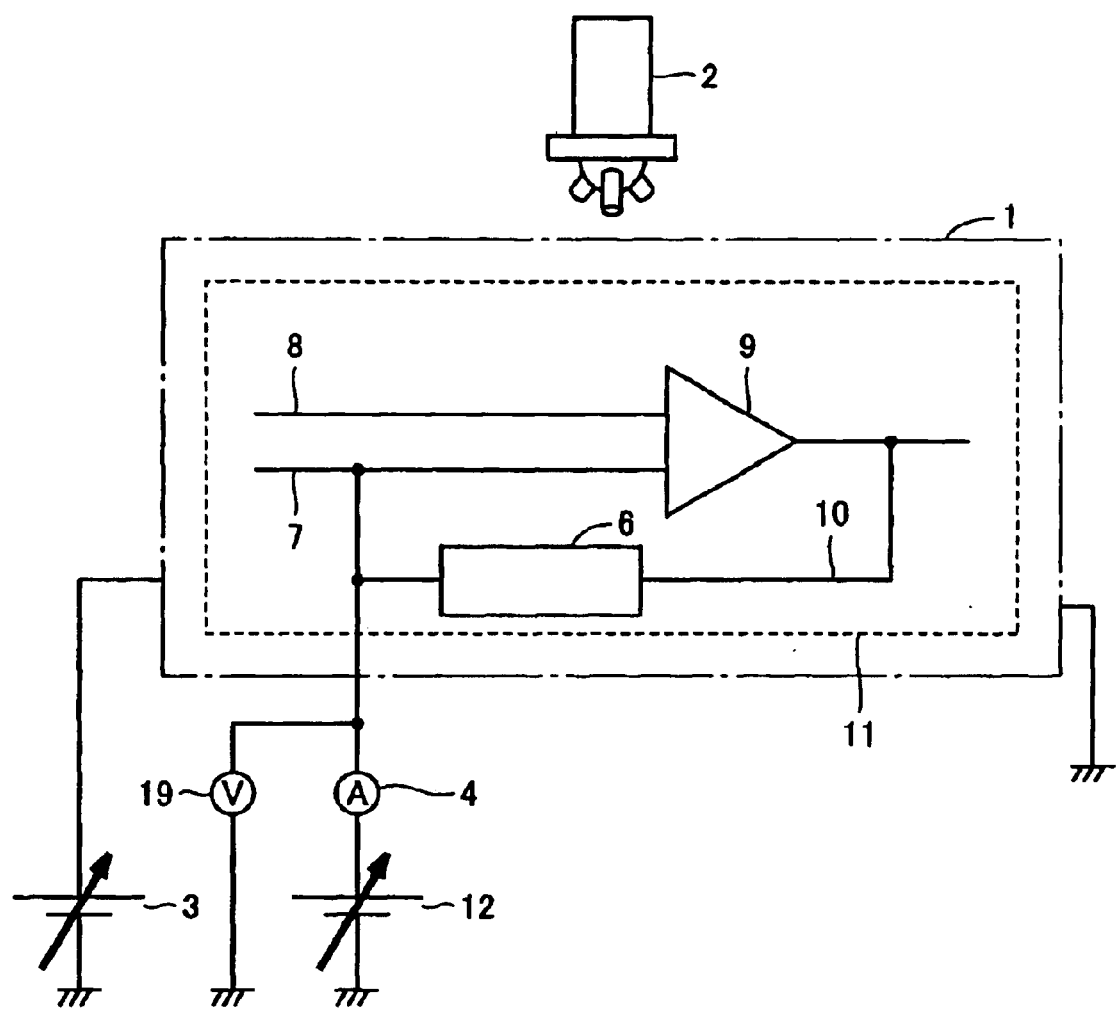
FIGS. 13 and 14 are schematic diagrams illustrating configurations of the semiconductor failure analysis device according to a third embodiment of the present invention.

Referring to FIG. 13, the semiconductor failure analysis device according to the third embodiment in one configuration includes a semiconductor device 1 provided with an internal voltage generating circuit 11 for which failure analysis is conducted, a laser microscope 2 applying light energy or thermal energy to semiconductor device 1, a variable stabilizing power source 3 applying a variable voltage to semiconductor device 1, a variable power source 12 applying a variable voltage from the outside of semiconductor device 1 to a wiring 7 of a voltage V in internal voltage generating circuit 11, an amperemeter 4 measuring a change of a current flowing through semiconductor device 1 at the time of failure analysis from a variable voltage application terminal 20 of variable power source 12, and a voltmeter 19 measuring an internal voltage being generated at the time when semiconductor device 1 is suffering failure.

Figure 14:
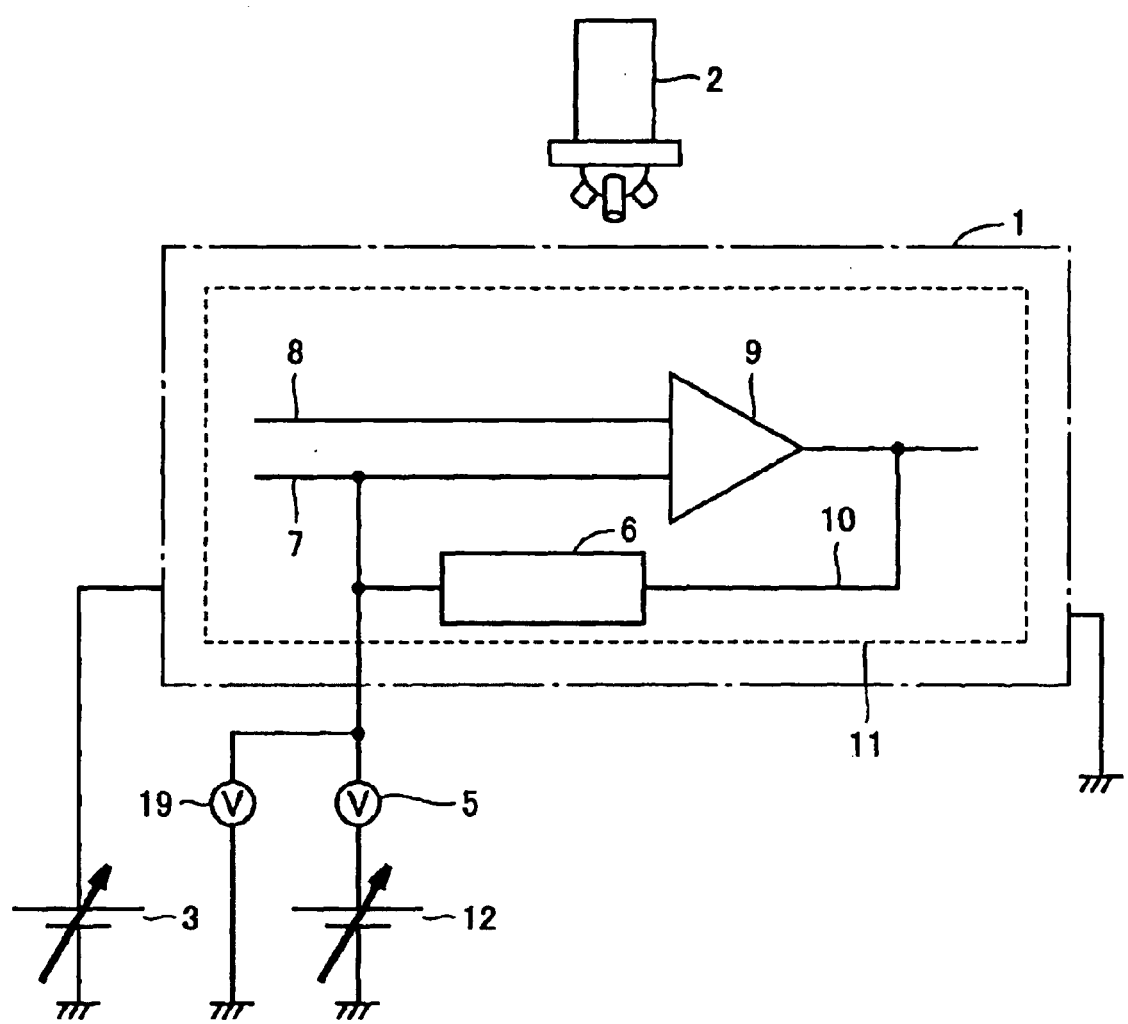

Referring to FIG. 14, the semiconductor failure analysis device according to the third embodiment in another configuration includes a semiconductor device 1 provided with an internal voltage generating circuit 11 for which failure analysis is conducted, a laser microscope 2 applying light energy or thermal energy to semiconductor device 1, a variable stabilizing power source 3 applying a variable voltage to semiconductor device 1, a variable power source 12 applying a variable voltage from the outside of semiconductor device 1 to a wiring 7 of a voltage V in internal voltage generating circuit 11, a voltmeter 5 measuring a change of a voltage being applied across semiconductor device 1 at the time of failure analysis from a variable voltage application terminal 20 of variable power source 12, and a voltmeter 19 measuring an internal voltage being generated at the time when semiconductor device 1 is suffering failure.

By such application of a voltage equivalent to the internal voltage being generated when semiconductor device 1 is suffering failure, sensitivity in failure detection becomes the greatest at a defective portion in semiconductor device 1. Accordingly, the defective portion of the semiconductor device is specified more accurately.

The power supply currents of the semiconductor device before and after externally applying a voltage using the semiconductor failure analysis device of the third embodiment are as explained in the first and second embodiments, so that description thereof is not repeated here.

Figure 15:
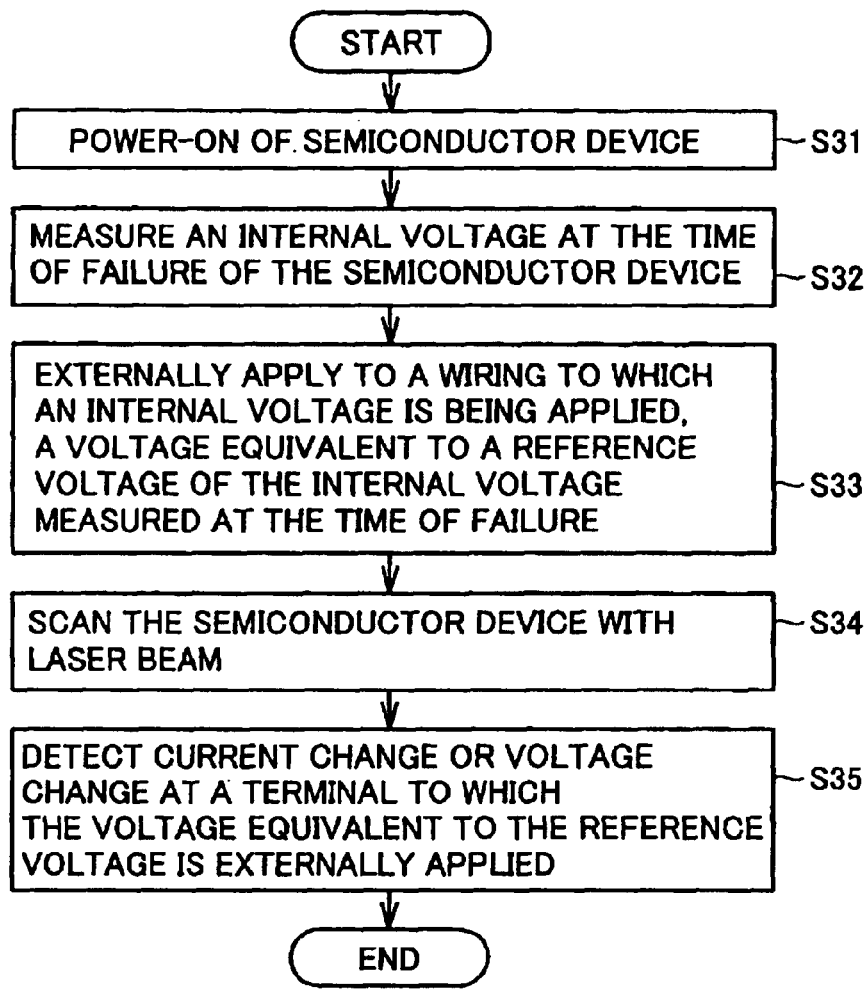
FIG. 15 is a flow diagram illustrating operational procedure of the semiconductor failure analysis device of the third embodiment.
Figure 16:
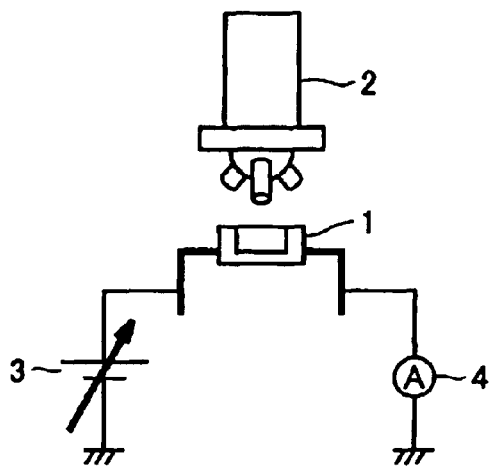
FIGS. 16–19 are schematic diagrams illustrating various configurations of a conventional semiconductor failure analysis device.
Figure 17:
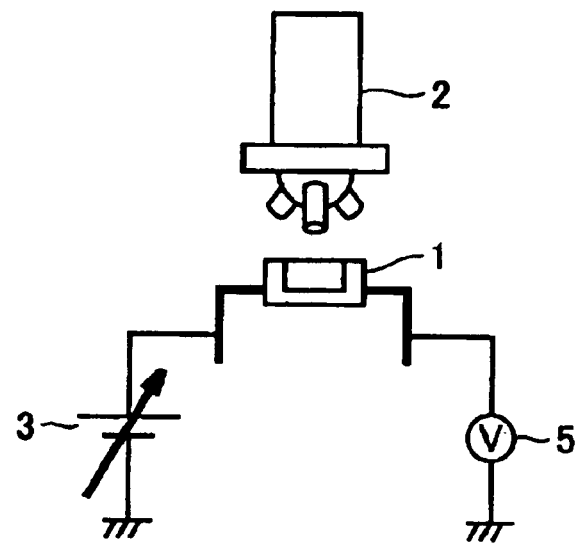
Figure 18:
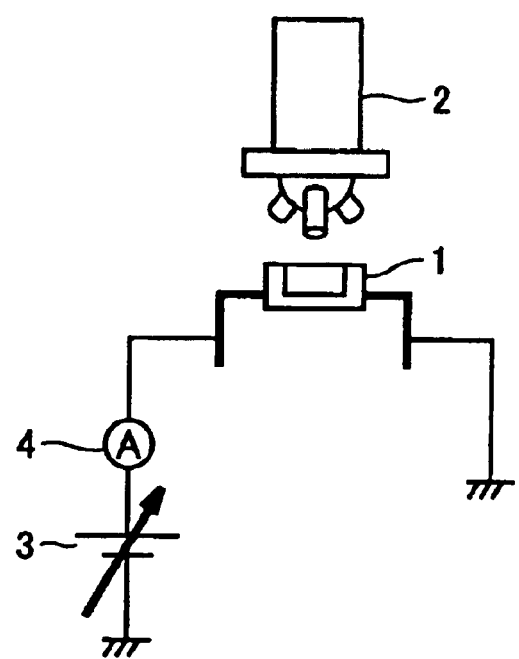
Figure 19:
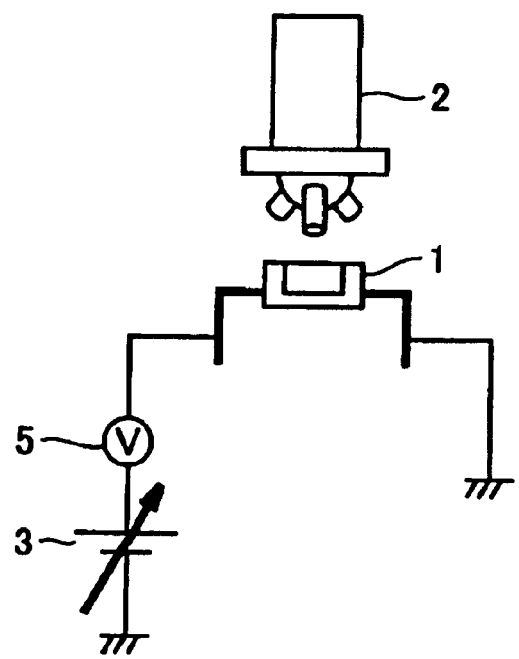
Figure 20:
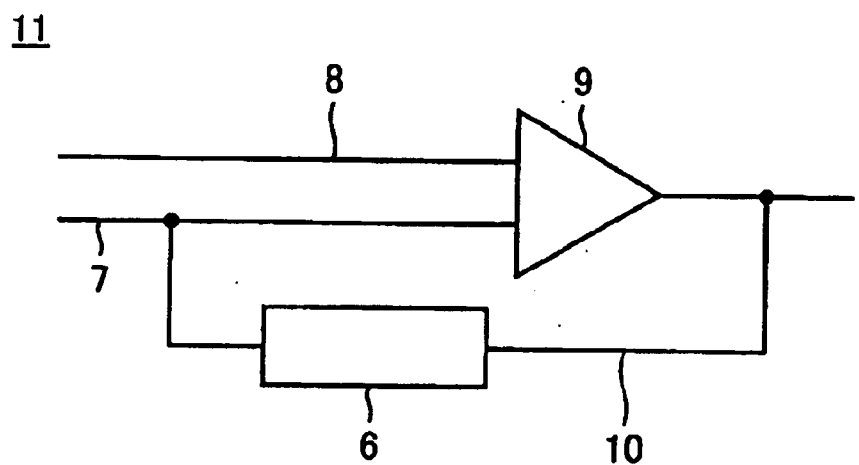
FIG. 20 is a schematic diagram of an internal voltage generating circuit 11 provided in a semiconductor device such as a DRAM.

The operational procedure of the semiconductor failure analysis device of the third embodiment is now described with reference to the flow chart in FIG. 15.

Firstly, in step S31, the semiconductor device is powered on.

In step S32, an internal voltage being generated when the semiconductor device is suffering failure is measured.

In step S33, a voltage equivalent to reference voltage Vref on wiring 8 at the time of failure is applied from the outside of the semiconductor device to wiring 7 of voltage V.

In step S34, the semiconductor device is scanned with a laser beam.

In step S35, a change in current or voltage is detected at a variable voltage application terminal of variable power source 12.

As described above, according to the third embodiment, by application of a voltage equivalent to the internal voltage being generated when the semiconductor device is suffering failure, sensitivity in failure detection becomes the greatest at a defective portion of the semiconductor device. Accordingly, the defective portion of the semiconductor device is specified more accurately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor failure analysis device analyzing failure in a semiconductor device provided with an internal voltage generating circuit, comprising:

a variable power source applying a voltage equivalent to a reference voltage of said internal voltage generating circuit to said internal voltage generating circuit to suspend said internal voltage generating circuit; and a failure detecting unit detecting a defective portion of said semiconductor device in a state where said internal voltage generating circuit is being suspended by said variable power source.

2. The semiconductor failure analysis device according to claim 1, wherein said failure detecting unit detects the defective portion of said semiconductor device from one of a power supply voltage terminal and a ground terminal of said semiconductor device.

3. The semiconductor failure analysis device according to claim 1, wherein said failure detecting unit detects the defective portion of said semiconductor device from a voltage application terminal of said variable power source.

4. The semiconductor failure analysis device according to claim 1, wherein said variable power source applies to said internal voltage generating circuit a voltage equivalent to a reference voltage of said internal voltage generating circuit at a time when said semiconductor device is suffering failure, and said failure detecting unit detects the defective portion of said semiconductor device from a voltage application terminal of said variable power source.

5. The semiconductor failure analysis device according to claim 1, wherein said failure detecting unit is one of an amperemeter and a voltmeter.

6. A semiconductor failure analysis device analyzing failure in a semiconductor device provided with an internal voltage generating circuit, comprising:

a voltage applying circuit applying, to a wiring in said semiconductor device to which an internal voltage is being applied, a voltage equivalent to a reference voltage of said internal voltage from outside of said semiconductor device to suspend said internal voltage generating circuit;

a light source scanning said semiconductor device with a laser beam; and a detecting circuit detecting one of a current change and a voltage change in said semiconductor device irradiated by said laser beam in a state where said internal voltage generating circuit is being suspended by said voltage applying circuit.

7. The semiconductor failure analysis device according to claim 6, wherein said detecting circuit detects one of the current change and the voltage change at one of a power supply voltage terminal and a ground terminal of said semiconductor device.

8. The semiconductor failure analysis device according to claim 6, wherein said detecting circuit detects one of the current change and the voltage change at a terminal to which the voltage equivalent to the reference voltage of said internal voltage is applied.

9. The semiconductor failure analysis device according to claim 6, further comprising a circuit measuring an internal voltage at a time when said semiconductor device is suffering failure, said voltage applying circuit applying a voltage equivalent to a reference voltage of the internal voltage at the time of said failure from the outside of said semiconductor device, and said detecting circuit detecting one of the current change and the voltage change at a terminal to which the voltage equivalent to the reference voltage of the internal voltage at the time of said failure is applied.

* * * * *